United States Patent [19]
Gauthier

[11] 3,938,009
[45] Feb. 10, 1976

[54] PRECISION CONTROL OF RELAY OPERATE AND RELEASE TIMES

[75] Inventor: John A. Gauthier, Brockville, Canada

[73] Assignee: GTE Automatic Electric (Canada) Limited, Brockville, Canada

[22] Filed: Sept. 27, 1974

[21] Appl. No.: 510,085

[52] U.S. Cl. .......................................... 317/148.5 R
[51] Int. Cl.² .......................................... H03H 9/00
[58] Field of Search .......... 317/141 S, 157, 148.5 R, 317/148.5 B, 123

[56] References Cited
UNITED STATES PATENTS

| | | | |
|---|---|---|---|
| 3,391,305 | 7/1968 | Bradwin et al. | 317/141 S |
| 3,721,908 | 3/1973 | Jurjans | 317/141 S X |

Primary Examiner—R. N. Envall, Jr.

[57] ABSTRACT

A shift register is provided with two inputs and two outputs. One input is from a free running clock and a second input is provided for relay operate and release signals. The two outputs are coupled to a NAND gate to provide a longer relay operate than release time. The two outputs are coupled to a NOR gate for a longer relay release time than operate time. Either gate output is coupled to a relay driver to operate the relay.

3 Claims, 7 Drawing Figures

PRECISION CONTROL OF RELAY OPERATE AND RELEASE TIMES

CROSS REFERENCES TO RELATED APPLICATIONS

This invention is incorporated in the Software Oriented Sender by Gauthier, Ser. No. 510,084, and in the Register and Sender Arrangement by Moorehead and Gauthier, Ser. No. 510,081, filed the same day as this application.

BACKGROUND OF THE INVENTION

1. Field of the Invention

The invention relates to the precision control of operate and release times for relays.

2. Description of the Prior Art

The invention was developed for the system shown in U.S. Pat. No. 3,767,863, issued Oct. 23, 1973, by Borbas et al. for a Communication Switching System with Modular Organization and Bus, hereinafter referred to as the System S2 patent.

Various methods have been used in the past to try to control the operate and release times of relays in order to accomplish various logic and switching requirements. In System S2, one such requirement is controlling the operate and release time of a specific relay (Relay B in sender) in order to close and release the contacts of the switching network when a signal is not being applied to those contacts, and to do so throughout a whole system so that a path has been formed before a signal is applied. One method used previously was to put copper slugs on certain types of relays (Class B) in order to obtain the slow to operate or slow to release relay. A second method involved using electrolytic capacitors and resistors in cooperation with the relays to provide the desired delays. These two methods produced delays which were not of sufficient accuracy for the System S2.

A third method was the combination of a unijunction transistor and SCR device. This method, although fairly accurate, presents a high circuit cost. All three of these methods were adaptable to provide only a specific operate time or a specific release time. In those particular methods to provide both a specific operate and a specific release time was extremely difficult.

SUMMARY OF THE INVENTION

According to the invention a shift register is provided with a clock pulse from any convenient clock in a system and a second input providing the relay operate and release signal. The two outputs of the shift registers are coupled to the inputs of a NAND gate for a longer operate than release time or a NOR gate for a longer release than operate time. The output of the gate is fed to the relay driver and the relay driver output is fed to the relay.

A first object of the invention is to provide varied operate and release times for relays.

A second object of the invention is to provide an accurate and specific release and operate times for relays.

A third object of the invention is to extend the operational life of the switching network relays in a switching system.

A fourth object of the invention is to provide a longer operate than release time for a relay.

A fifth object of the invention is to provide a shorter operate than release time for a relay.

A sixth and final object of the invention is to provide a circuit which can be readily tested with an automatic card test.

BRIEF DESCRIPTION OF THE DRAWINGS

The above mentioned and other features and objects of this invention and the manner of obtaining them will become more apparent and the invention itself will be best understood by reference to the following description of an embodiment of the invention taken in conjunction with the accompanying drawings in which.

DESCRIPTION OF THE PREFERRED EMBODIMENT

Figures 1, 2:
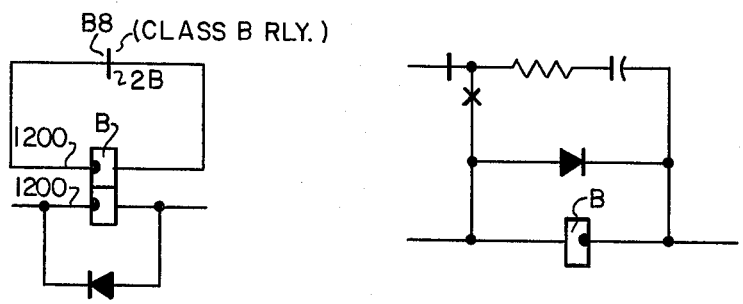
FIG. 1 is a prior art configuration of a relay with a slug.
FIG. 2 is a prior art configuration using resistors and capacitors with a relay.

FIG. 1 shows a prior art configuration used in a Class B relay with one winding shorted to act as a slug. This produces a slow to operate relay. The Class B type relay is a large relay which is designed to mount on a relay plate and therefore cannot be easily adapted to card mounting. This configuration accomplishes dry switching and overlap releasing using only one relay. The shorted oil acting as a slug serves to provide the slow operate while the open coil provides a small delay on the release. The delays obtained are not very accurate.

FIG. 2 shows a prior art configuration for a method of a slow to release relay using the resistor capacitor combination. This configuration provides overlap releasing with a delay of about 25 to 50 milliseconds before the network is allowed to drop. This circuit will only produce a slow to release relay.

Figure 3:
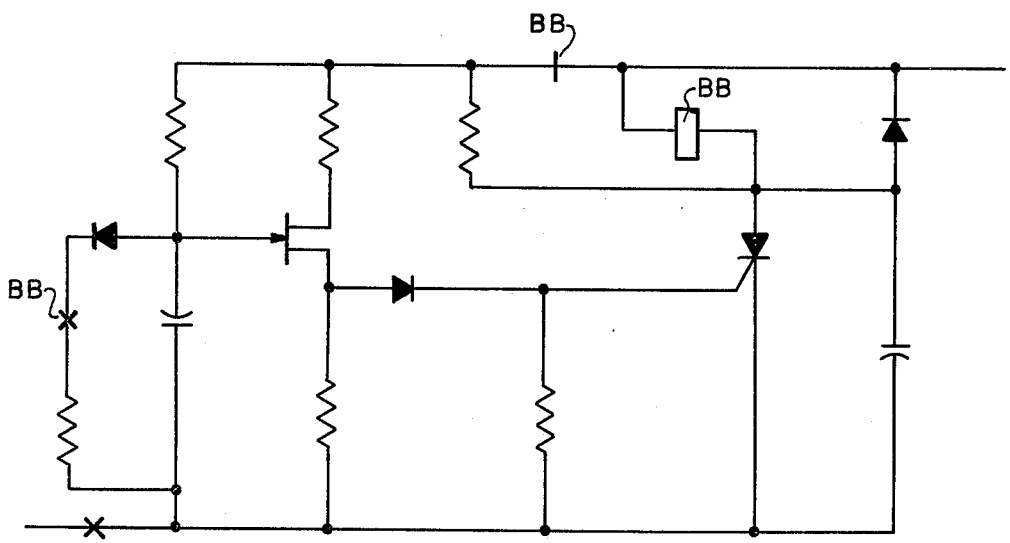
FIG. 3 is a prior art configuration using a unijunction transistor and SCR device.

FIG. 3 shows a prior art configuration using a unijunction transistor and an SRC device in combination to provide a slow to operate relay. Here the BB relay is the slow to operate relay. Its design is to allow the network switches to operate before its contacts on the + lead and the − lead close. In this way the DC current which flows through the + and − leads is switched on through these contacts rather than the network switch contacts. Using the configurations of FIG. 2 and FIG. 3, both configurations must be used to have the slow to operate and slow to release features provided by the single circuit of the invention. There are thus two circuits and two relays which will produce fairly accurate release and operate times, however, the circuit is expensive.

Figure 4:
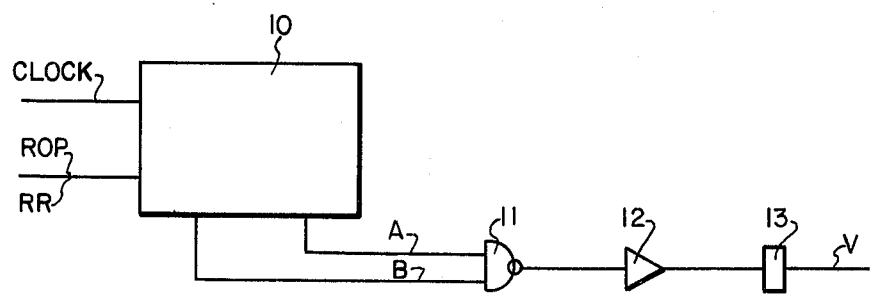
FIG. 4 is a schematic diagram of the system with longer operate than release time.

FIG. 4 shows one form of the operate and release time system of the invention which is composed of 7400-Series Transistor Transistor Logic (TTL). The circuit is composed of commercial 7400 circuits including a 74164 serial input parallel output eight bit shift register, a 7400 NAND gate, and a 7407 hexed buffer driver.

A clock pulse is one input to shift register 10 and a second input is provided for the relay operate signals (ROP) and the relay release signal (RR). This clock pulse may be derived from any convenient clock in the circuitry or of course could be a clock provided with the system itself. Such a clock is disclosed in the co-pending application to Moorehead and Gauthier. Two outputs are taken from the shift register 10 and fed to NAND gate 11. The inputs A and B are chosen for whatever particular delay is desired. This delay may be varied by picking the different outputs of the shift register however the operate time of the relay in this configuration must always be greater than the release time. The output from NAND gate 11 is then fed to the relay driver 12 and than to the relay 13 itself.

Figure 5:
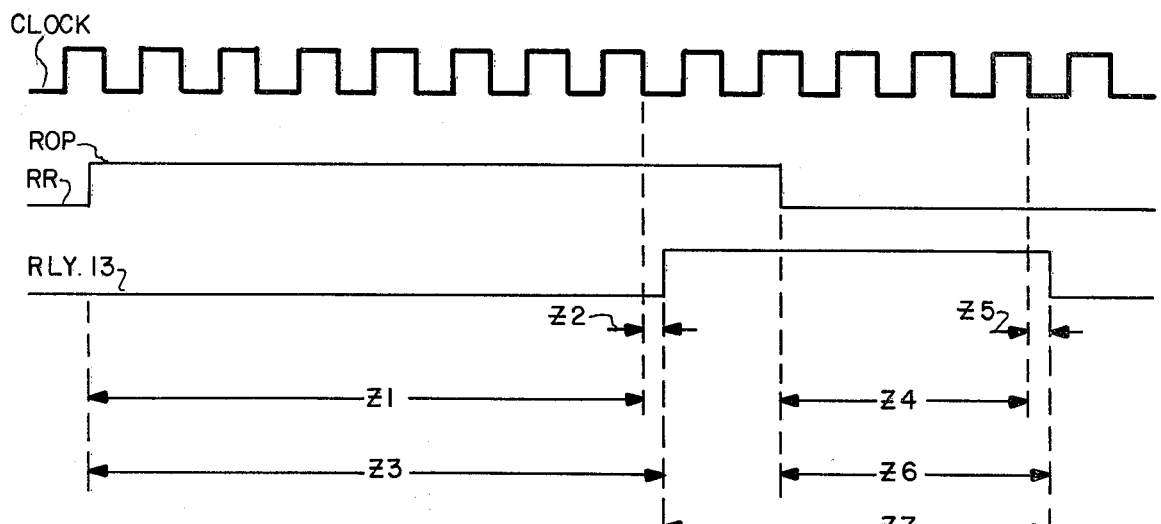
FIG. 5 is a timing diagram showing the timing of the embodiment of FIG. 4.

The operation of the system of FIG. 4 is shown in FIG. 5. When the signal ROP appears the shift register will shift 1's for the period Z1 at which time the relay is operated which takes an actual time of Z2. The total apparent time for the relay to operate after ROP appears is Z3. When ROP is released (indicated by signal RR) there again is a delay time when a shift register is shifting 0's the delay being Z4. At the end of Z4 the actual release time Z5 occurs which has produced a total apparent time to release the relay 13 of Z6. The actual time the relay 13 has been operated is represented by Z7.

Figure 6:
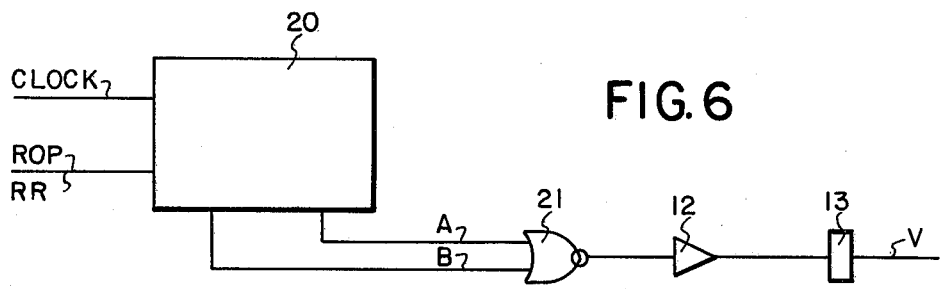
FIG. 6 is a schematic diagram of the device with shorter operate than release time.

FIG. 6 shows a second configuration of the device. The same two inputs are presented to shift register 20. However, the outputs of shift register 20 are now input to 7402 NOR gate 21. This reverses the functions of the two outputs of the shift register and now the operate time will be less than the relay release time. The output of NOR gate 21 is also fed to a relay driver 12 and its output is fed to the relay 13.

Figure 7:
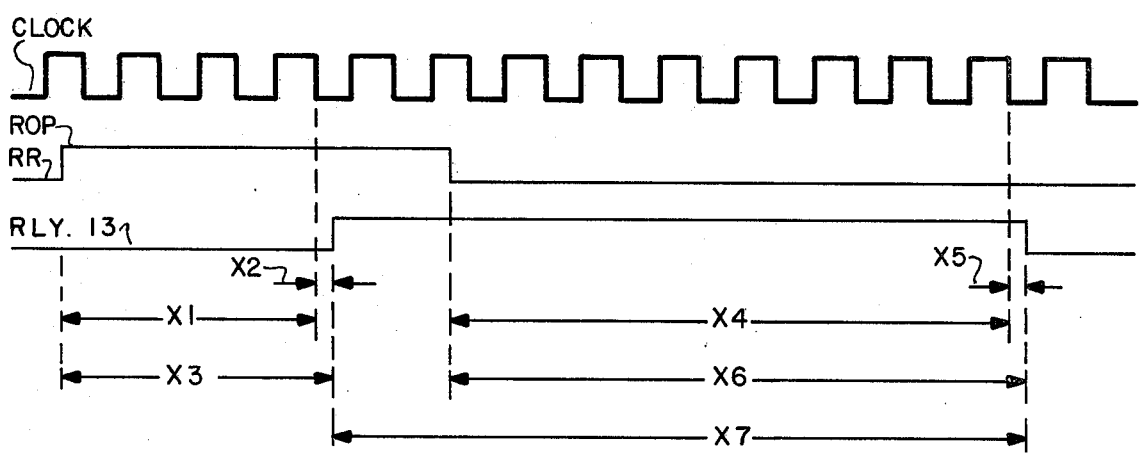
FIG. 7 shows the timing diagram for the embodiment of FIG. 6.

The operation of this configuration is shown in FIG. 7. When signal ROP is applied to the shift register 20 there is a delay in activating the relay of X1. When the relay is operated it takes an actual time of X2 which gives an apparent relay operate time of X3. Upon the relay release signal being present the delay in releasing the relay is shown by period X4. The actual time to release the relay is shown by X5. This makes a total apparent relay release time of period X6. Thus for this particular configuration the relay 13 has been operated for a total period of X7.

The accuracy which can be obtained using this method can be readily varied and adapted to the actual requirements of the system in which it is used. The factors which influence the accuracy are:

1. ± ½ clock period;
2. ± inherent relay tolerances;
3. ± clock frequency tolerance.

The frequency of the clock, the length of the shift register, and the positioning of the A and B inputs of the NAND or NOR gate used can all be varied in order to obtain the circuit configuration which best satisfies the actual system requirements. In this manner accuracy is obtained with a very few integrated components which provides a very low system cost.

The invention has been illustrated in one specific area of the telephone system. There are, however, many other areas within the telephone system in which it could be used. A few of such areas are trunk circuits, trunk adapters, and markers.

Further the invention can also be used in any system where having every relay or solenoid controlled from one master clock would be a desirable feature. One clock adjustment in such a system would set up all the sequential operations within the machine. Such a system would perhaps be a numerical control machine which requires many logical steps to occur one after the other.

All principles of the invention have been illustrated above in connection with specific apparatus and applications, and it should be understood the description is made only by way of example and not as a limitation on the scope of the invention as encompassed by the following claims:

What is claimed is:

1. A system for varied accurate relay operate and release times including, a relay, a free running clock producing clock pulses, and relay operate and release signals, said system comprising:
    a single shift register device having one input coupled to said clock pulses and a second input coupled to said relay operate and release signals;
    a single output gate means coupled to said shift register device; and
    relay driver means coupled to said output gate means and to said relay.

2. A system of claim 1 wherein said output gate means comprises:
    NAND gate means;
    whereby said relay has a longer operate than release time.

3. A system of claim 1 wherein said output gate means comprises:
    NOR gate means;
    whereby said relay has a longer release than operate time.

* * * * *